(12) United States Patent
Vos

(10) Patent No.: US 9,588,147 B2
(45) Date of Patent: Mar. 7, 2017

(54) ELECTRONIC INTEGRATOR FOR ROGOWSKI COIL SENSORS

(71) Applicant: 3M INNOVATIVE PROPERTIES COMPANY, St. Paul, MN (US)

(72) Inventor: Martin J. Vos, St. Paul, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 113 days.

(21) Appl. No.: 14/613,589

(22) Filed: Feb. 4, 2015

(65) Prior Publication Data
US 2016/0223592 A1   Aug. 4, 2016

(51) Int. Cl.
*G01R 15/18* (2006.01)
*G01R 19/25* (2006.01)

(52) U.S. Cl.
CPC ........ *G01R 15/181* (2013.01); *G01R 19/2506* (2013.01)

(58) Field of Classification Search
CPC ............................... G01R 15/181; G01R 19/00
USPC ......................................................... 324/127
See application file for complete search history.

(56) References Cited

U.S. PATENT DOCUMENTS

| | | | |
|---|---|---|---|
| 2,969,183 A | 1/1961 | Voelcker, Jr. | |
| 3,610,908 A | 10/1971 | Karosas | |
| 4,035,809 A | 7/1977 | Jacobsen | |
| 6,614,218 B1 | 9/2003 | Ray | |
| 6,919,835 B2 | 7/2005 | Welles | |
| 7,532,000 B2 * | 5/2009 | Kovach | G01R 15/181 324/117 H |
| 8,319,628 B2 | 11/2012 | Schweitzer | |
| 2007/0034609 A1 | 2/2007 | Murai et al. | |
| 2007/0279042 A1 * | 12/2007 | Tan | G01R 15/181 324/142 |
| 2010/0302385 A1 * | 12/2010 | Kurihara | H04N 5/23248 348/208.4 |

(Continued)

FOREIGN PATENT DOCUMENTS

| | | |
|---|---|---|
| DE | 126867 | 8/1976 |
| JP | H133744 A | 2/1999 |

(Continued)

OTHER PUBLICATIONS

Metwally, "Design of Different Self-Integrating and Differentiating Rogowski Coils for Measuring Large-Magnitude Fast Impulse Currents," IEEE Transactions on Instrumentation and Measurement, Aug. 2013, vol. 62, No. 8, pp. 2303-2313.

(Continued)

*Primary Examiner* — Christopher Mahoney

(57) ABSTRACT

An integrator circuit for a current sensor such as a Rogowski coil. The integrator circuit includes an integrator having an input for receiving a signal from a current sensor and having an output providing a voltage signal. A high-pass filter has an input coupled to the output of the integrator and substantially removes the DC content from the voltage signal. A feedback loop has an input coupled to the output of the integrator and to the high-pass filter, and has an output providing the DC content of the voltage signal back to the input of the integrator. The integrator circuit can detect large current steps in the line conductor being monitored and can be used for line fault detection.

11 Claims, 5 Drawing Sheets

(56) References Cited

U.S. PATENT DOCUMENTS

2013/0296665 A1* 11/2013 Kassim .............. G01N 21/3151
                                                                                    600/310
2014/0171935 A1    6/2014  Digmann et al.

FOREIGN PATENT DOCUMENTS

JP        H11281678 A    10/1999
JP        2004-279139    * 10/2004  ............. G01R 19/00

OTHER PUBLICATIONS

"Rogowski Coil with an Active Integrator for Measurement of Switching Impulse Current," (ISBN: 9781479905454) 2013 IEEE.
PCT International Search Report for PCT/US2016/013783, mailed Apr. 29, 2016.

* cited by examiner

ELECTRONIC INTEGRATOR FOR ROGOWSKI COIL SENSORS

BACKGROUND

A Rogowski coil sensor 12 is shown in FIG. 1. The flexible coil 12 can be clamped around a current carrying conductor 10 without interrupting the conductor circuit, is linear over all practical current ranges, and forms therefore an attractive current sensor solution in the AC power industry. With the AC line centered in the coil 12, the produced voltage V is:

$$V_{in} = \frac{\mu_0 n A}{2\pi r} \frac{dI}{dt} \quad A << r^2$$

with $\mu_0$ the permeability of free space, n the number of turns of the coil, A the coil cross section, r the radius as shown in FIG. 1, and I the line current. The voltage V is proportional to the differentiated line current, and signals V and I will thus show a 90 degree phase difference. A signal V in phase with current I will require integration. Integration will also lead to the correct current profile if higher harmonics are involved.

FIG. 1 shows an example of an integrator 14 coupled to coil 12 at terminal 16 with basic harmonic transfer function:

$$\frac{V_{out}}{V_{in}} = \frac{R_1}{R_3} \frac{1}{1 + j\omega R_1 C_1}$$

Integrator 14 with the shown component values is an inadequate solution when accurate phase information is required. The $\omega RC$ product at 60 Hz is only about 1.2 resulting in integrator 14 having a substantial undesirable phase shift at the line frequency. The desired phase shift of 90 degrees is obtained with removing $R_1$ so that the transfer function obtains the pure integrator form:

$$\frac{V_{out}}{V_{in}} = \frac{1}{j\omega R_3 C_1}$$

The practical problem with this transfer function is that the amplification at DC becomes infinite. As a result, the output can contain an undefined DC level that in essence represents the integration constant leaving the feedback capacitor $C_1$ DC charged. Scholastic indefinite integral calculus exercises ignore the integration constant, i.e. make it zero, and the challenge is now to extend this convenience to the present practical case. One remedy is to place a transistor (MOSFET) across the feedback capacitor $C_1$ to occasionally discharge it so that the OPAMP 15 DC output becomes redefined. This approach requires timing circuitry to discharge infrequently but still regularly at a preferred moment. When well implemented with near perfect MOSFETs this approach can provide for the remedy.

Accordingly, a need exists for an improved integrator for Rogowski coils or other current sensors.

SUMMARY

An integrator circuit for a current sensor, consistent with the present invention, includes an integrator having an input for receiving a signal from a current sensor and having an output providing a voltage signal. A high-pass filter has an input coupled to the output of the integrator and has an output, and the high-pass filter substantially removes a DC content from the voltage signal. A feedback loop has an input coupled to the output of the integrator and to the output of the high-pass filter, and has an output providing the DC content of the voltage signal to the input of the integrator.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

An improved integrator for a Rogowski coil sensor, or other current sensors, is disclosed. Rogowski coil sensors are routinely used to monitor or measure 60 Hz line currents in the AC power grid. Developments in the smart grid infrastructure will require vast deployment of these sensors. Rogowski sensors are commercially available and require a preamplifier to bring the coil amplitude to an acceptable level. Generally, a Rogowski coil produces roughly 25 µV per ampere of line current, too weak to be directly useful for processing electronics that prefer an amplification of about 1 mV/A. Commercial preamplifiers or transducers are available, but they often produce a DC signal resulting in loss of the AC phase information. In order to obtain a phase accurate 60 Hz amplified replica of the line current, a new integrator design is disclosed. This integrator design is an improved solution to the remedy described above and involves adherence to the second transfer function above for the pure integrator form without requiring placement of any component across the feedback capacitor, using continuous monitoring of the DC level and forcing it to zero through stable feedback.

Figure 1:
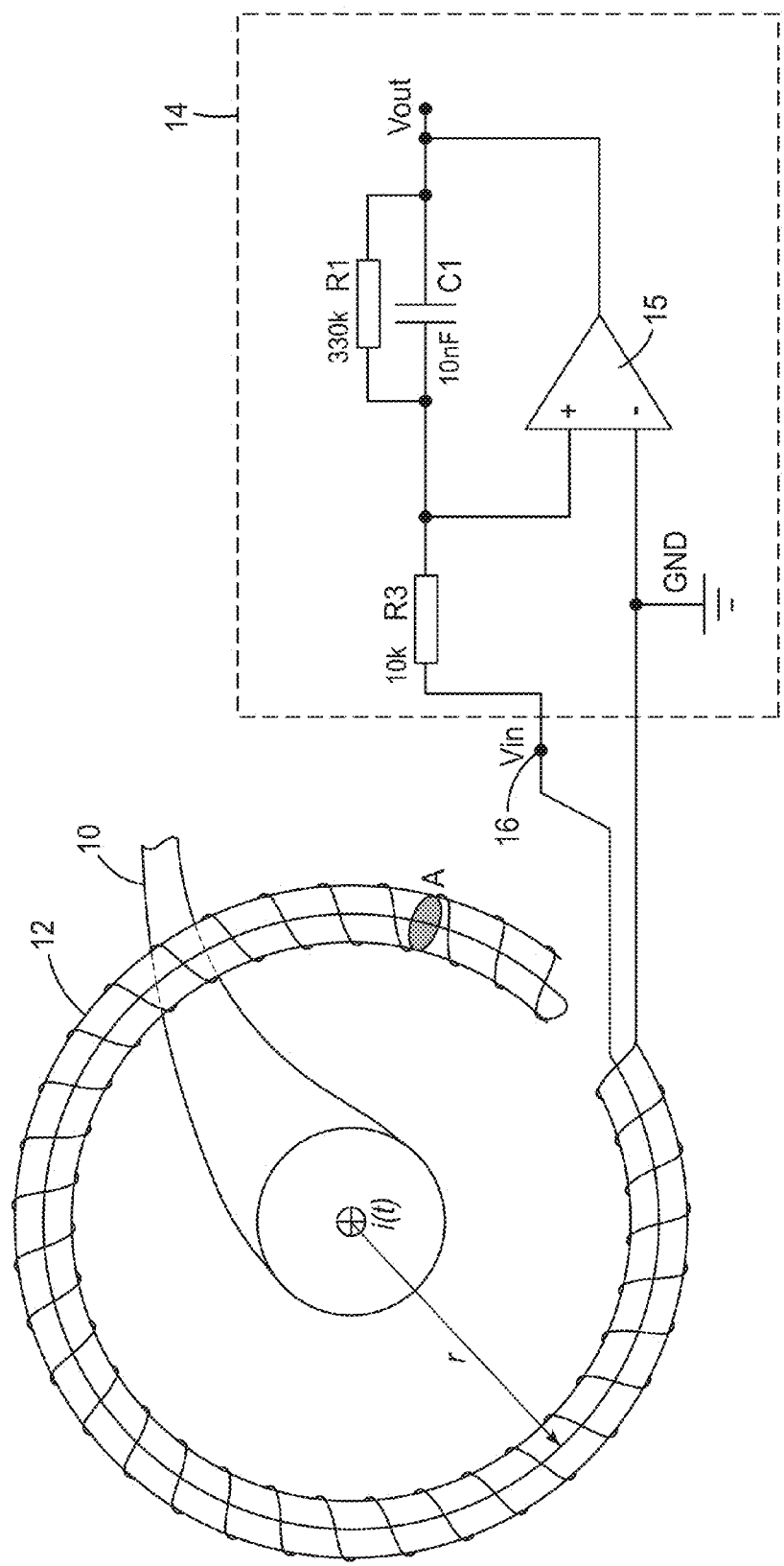
FIG. 1 is a diagram of a prior art integrating preamplifier for a Rogowski coil sensor.
Figure 2:
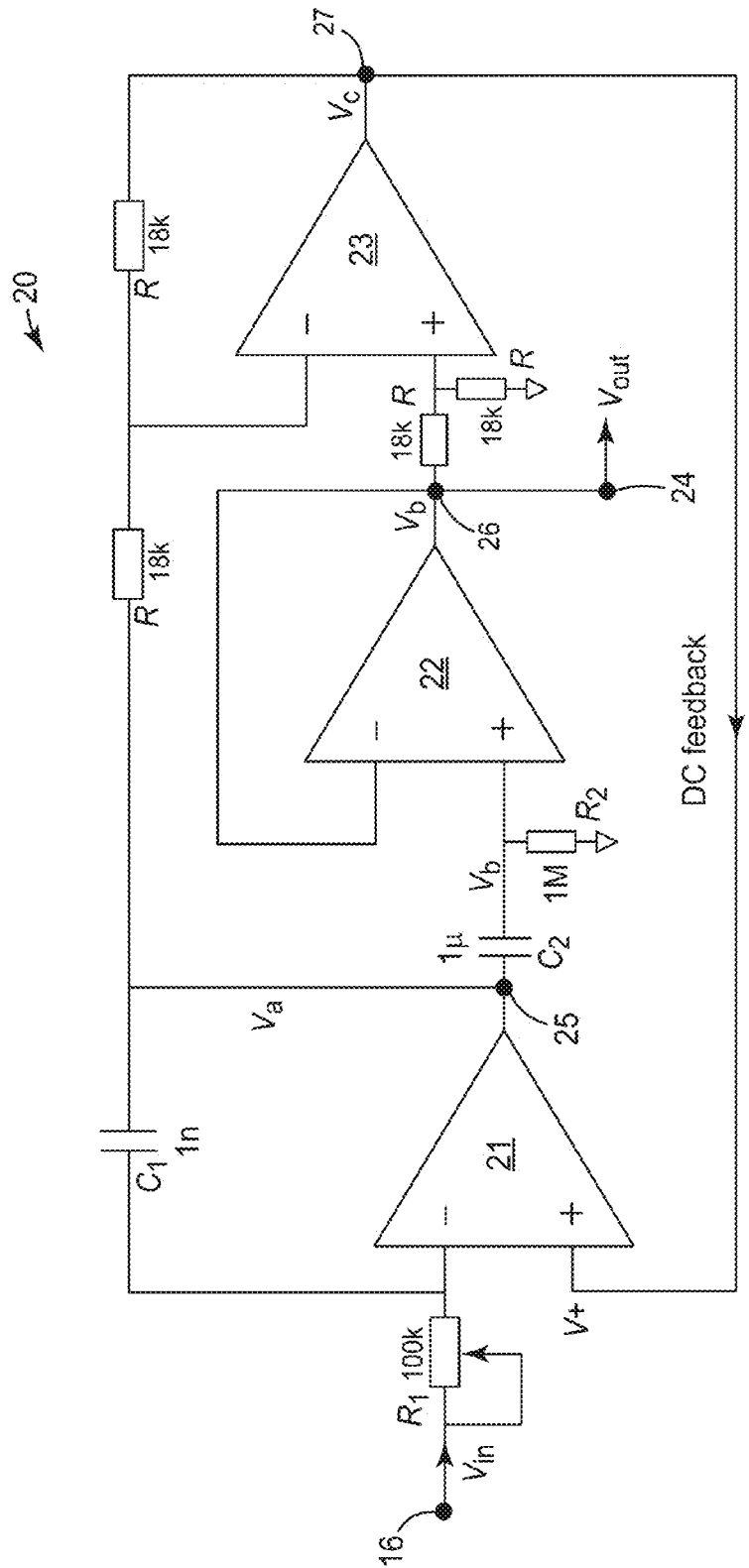
FIG. 2 is a diagram of an integrator circuit for a Rogowski coil sensor.

FIG. 2 is a diagram of an integrator circuit 20 solution containing three OPAMPs (operational amplifiers) 21, 22, and 23. The first OPAMP 21 is a pure integrator having an input receiving a signal from the Rogowski coil sensor at terminal 16 and having an output (25) providing the signal $V_a$. The inverting input of OPAMP 21 may have a pull-down resistor to ground of, for example, 1 MΩ. OPAMP 21 is followed by a passive first order high-pass filter, formed by capacitor $C_2$ and resistor $R_2$, having an input receiving the signal $V_a$ and having an output delivering a DC free version of the integrated signal to the + input of the second OPAMP 22 serving as a voltage follower and having an output (26) providing the signal $V_b$. The high-pass filter can remove the DC content of the signal $V_a$ or substantially remove the DC content by an acceptable amount for operation of circuit 20. The voltage follower (OPAMP 22) is used to minimize the load on the high impedance point formed by the high-pass filter output. The third OPAMP 23 is a difference amplifier (that in this case does not amplify) having an output (27) producing a copy of the DC content of the first OPAMP 21 output. Closing the DC feedback loop from the output $V_c$ of OPAMP 23 to the + input $V^+$ of OPAMP 21 then guarantees that the integrator output of the first OPAMP 21 remains DC free.

Integrator circuit 20 receives a signal from a Rogowski coil sensor, or other current sensor, at terminal 16 and provides an output signal $V_{out}$ at terminal 24. Circuit 20 outputs a signal at terminal 24 related to the signal from the current sensor, for example a decaying ringing signal in response to a large current step in the line conductor monitored by the current sensor. Circuit 20 at output terminal 24 can be coupled to an analog-to-digital converter in order to provide a corresponding digital signal to a processor for use in smart grid infrastructure monitoring such as line fault analysis, for example. Circuit 20 can also be used to monitor and detect line faults in three-phase cables.

Figure 3:
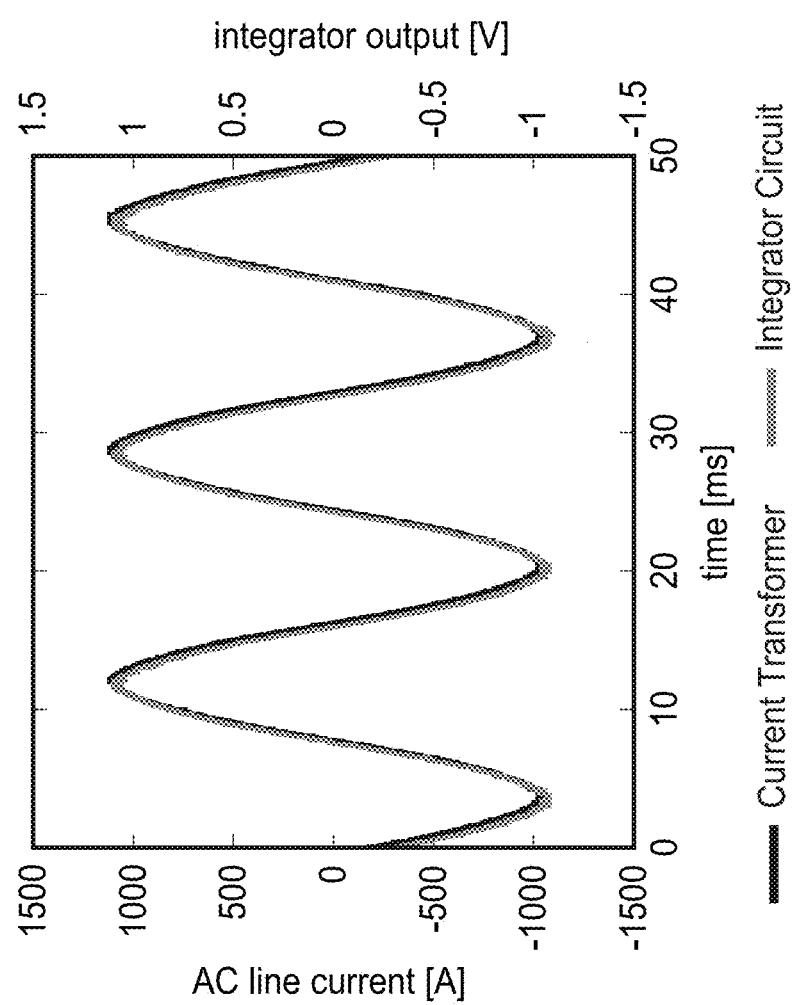
FIG. 3 is a graph comparing line current measured by a current transformer and the integrator circuit of FIG. 2.

The performance of circuit 20 is shown in FIG. 3, comparing a line current measured by a current transformer (Hammond CT500A) and by integrator circuit 20 in FIG. 2. With the potentiometer $R_1$ (variable resistor) in circuit 20 adjusted to a 1 mV/A amplification, the traces in FIG. 3 show almost perfect correspondence with a minute and generally acceptable phase difference.

The following provides harmonic analysis of the operation of circuit 20. If the non-inverting input voltage V+ is at ground potential, then the transfer function of the first OPAMP 21 integrator is:

$$\frac{V_a}{V_{in}} = -\frac{1}{j\omega R_1 C_1} = -\frac{1}{j\omega\tau_1} \quad (1)$$

The function in equation (1) is that of an ideal integrator with a pole at DC or more realistically at a very low frequency with extremely high amplification. If the primary application forms an integrator for a 60 Hz signal, as in this exemplary case, then the integration of low frequency noise results in a slowly varying drift with large amplitude that becomes a nuisance. This nuisance can be avoided by occasionally resetting the integrator DC state or by limiting the amplification at low frequencies that are not of interest.

Accordingly, one remedy involves occasionally discharging the capacitor $C_1$ by shorting it through a MOSFET, effective but not the most elegant solution. Another common remedy to limit the amplification at low frequencies is to place a large feedback resistor $R_f$ across capacitor $C_1$ so that the amplification at DC is at most equal to the ratio $R_f/R_1$ of resistors $R_f$ and $R_1$. In practice, this ratio is still much larger than unity so that the slow drift nuisance is diminished but not removed. Further improvement can be obtained if the amplification tends to approach zero at DC. Such is the case with circuit 20 in FIG. 2 as the following harmonic analysis demonstrates.

The voltages indicated in FIG. 2 are all referenced to ground. With w the angular frequency, two basic transfer functions are provided by:

$$\frac{V_b}{V_a} = -\frac{j\omega R_2 C_2}{1 + j\omega R_2 C_2} = -\frac{j\omega\tau_2}{1 + j\omega\tau_2} \quad (2)$$

and with all resistors R's having equal values:

$$V_c = V_b - V_a \quad (3)$$

Considering an arbitrary $V^+$ input voltage, the derivation of the first OPAMP 21 integrator transfer function requires the following two equations:

$$-V_{in} + iR_1 + V^+ = 0 \quad (4)$$

$$-V_{in} + i\left(R_1 + \frac{1}{j\omega C_1}\right) + V_a = 0 \quad (5)$$

Removing current i from equations (4) and (5):

$$V_a = -V_{in}\frac{1}{j\omega\tau_1} + V^+\left(\frac{1 + j\omega\tau_1}{j\omega\tau_1}\right) \quad (6)$$

Equating voltage $V^+$ to voltage $V_c$ through direct feedback, as shown in circuit 20, and combining equations (2), (3), and (6):

$$\frac{V_a}{V_{in}} = \frac{-1}{j\omega\tau_1 + \frac{1 + j\omega\tau_1}{1 + j\omega\tau_2}} \quad (7)$$

Clearly, equation (7) approaches an ideal integrator if $\tau_2 \gg \tau_1$ and a result reveals itself if the total integrator transfer function is derived:

$$\frac{V_{out}}{V_{in}} = \frac{V_b}{V_a}\frac{V_a}{V_{in}} = \frac{j\omega\tau_2}{1 + j\omega\tau_2} \cdot \frac{-1}{j\omega\tau_1 + \frac{1 + j\omega\tau_1}{1 + j\omega\tau_2}} = \frac{-1}{j\omega\tau_1 + \frac{2\tau_1}{\tau_2} + \frac{1}{j\omega\tau_2}} \quad (8)$$

The total transfer function in equation (8) becomes an excellent integrator when the following two conditions are both fulfilled:

1) $\tau_2 \gg \tau_1$

2) $\omega \gg \frac{1}{\tau_2}$

The desirable benefit becomes apparent when w approaches DC because then the output is eliminated as a result of differentiation related to the term $\omega\tau_2$. This is unlike a pure integrator in equation (1) where the amplification at DC tends to infinity.

Figure 4:
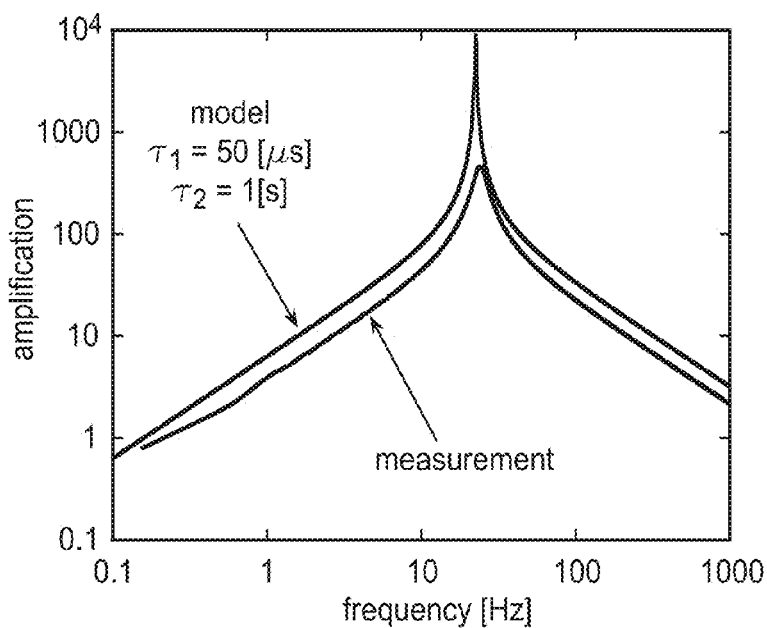
FIG. 4 is a graph of the amplitude response of the integrator circuit of FIG. 2.
Figure 5:
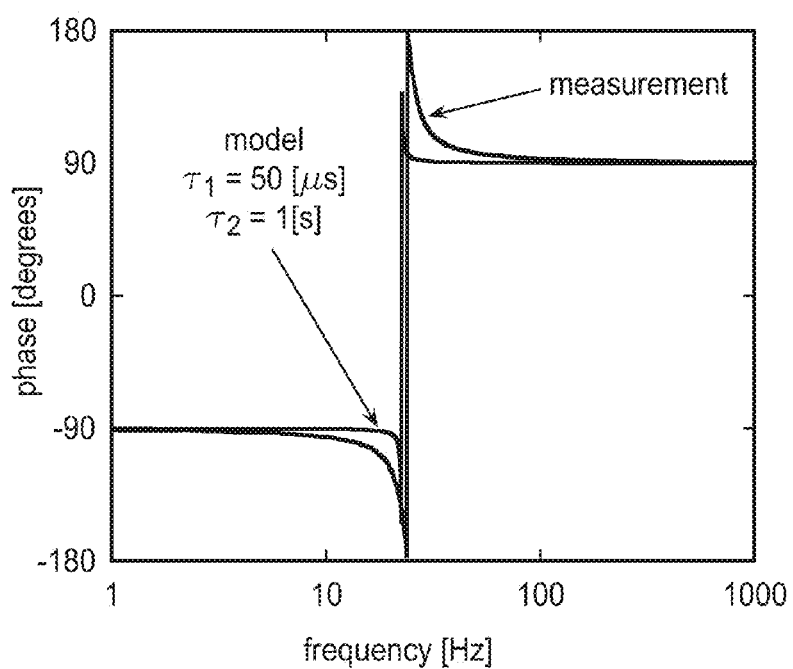
FIG. 5 is a graph of the phase response of the integrator circuit of FIG. 2.

The properties are further demonstrated by plotting the amplitude and phase responses of the transfer function in equation (8), as illustrated in FIGS. 4 and 5. The amplitude response of circuit 20 in FIG. 4 clearly shows a resonance peak marking the absolute lower limit of the usable frequency range for integration purposes. A resonance frequency $f_{res}$ is obtained by setting the phase of equation (8) to zero with the amplitude the maximum $\tau_2/(2\tau_1)$:

$$f_{res} = \frac{1}{2\pi}\sqrt{\frac{1}{\tau_1\tau_2}} \quad (9)$$

For a 60 Hz AC line current integrator, a design consideration can be to let $f_{res}$ not exceed about 10 Hz. Circuit 20 requires a low noise environment, especially near $f_{res}$, which for a monochromatic 60 Hz line signal can be comfortably assumed.

For further illustration purposes, the operation of circuit 20 can be compared against a first order filter circuit formed by placing a resistor $R_f$ across capacitor $C_1$. Such comparison will demonstrate the benefits of circuit 20 with an extremely sharp transition from differentiation to integration extending over only a few hertz bandwidth.

The following provides transient analysis of the impulse response of circuit 20. The Laplace transformed transfer function of circuit 20 is derived as:

$$\frac{v_{out}(s)}{v_{in}(s)} = p(s) = \frac{-1}{\tau_1} \frac{s}{s^2 + s\frac{2}{\tau_2} + \frac{1}{\tau_1 \tau_2}} = \frac{-1}{\tau_1} \frac{s}{(s+\omega_1)(s+\omega_2)} \quad (10)$$

and as also shown in equation 10, by defining a root r:

$$r = \sqrt{\frac{\tau_2}{\tau_1} - 1} \quad (11)$$

The frequencies $\omega_1$ and $\omega_2$ are evaluated as complex conjugates:

$$\omega_1 = \frac{1}{\tau_2}(1 + jr) \quad (12)$$

$$\omega_2 = \frac{1}{\tau_2}(1 - jr) \quad (13)$$

Based on Maxwell's equations, a Rogowski coil inductance terminated with a resistance is properly described by a first order differential equation. Impulse responses then have the form of exponential expressions of time. Analogously, an impulse response of exponential form can be obtained by differentiating a slow 100 mHz square wave from a wideband function generator over a 10 nF capacitor and a 50Ω resistor divider. Such an impulse is described by:

$$V_{in}(t) = V_0 e^{-\frac{t}{\tau_0}} = V_0 e^{-\omega_0 t} \quad (14)$$

With $\omega_0$ real and positive and with Laplace transform:

$$v_{in}(s) = \frac{V_0}{s + \omega_0} \quad (15)$$

Substituting equation 15 in equation 10, the impulse response spectrum becomes:

$$v_{out}(s) = v_{in}(s)p(s) = \frac{-V_0}{\tau_1} \frac{s}{(s+\omega_0)(s+\omega_1)(s+\omega_2)} \quad (16)$$

Figure 6:
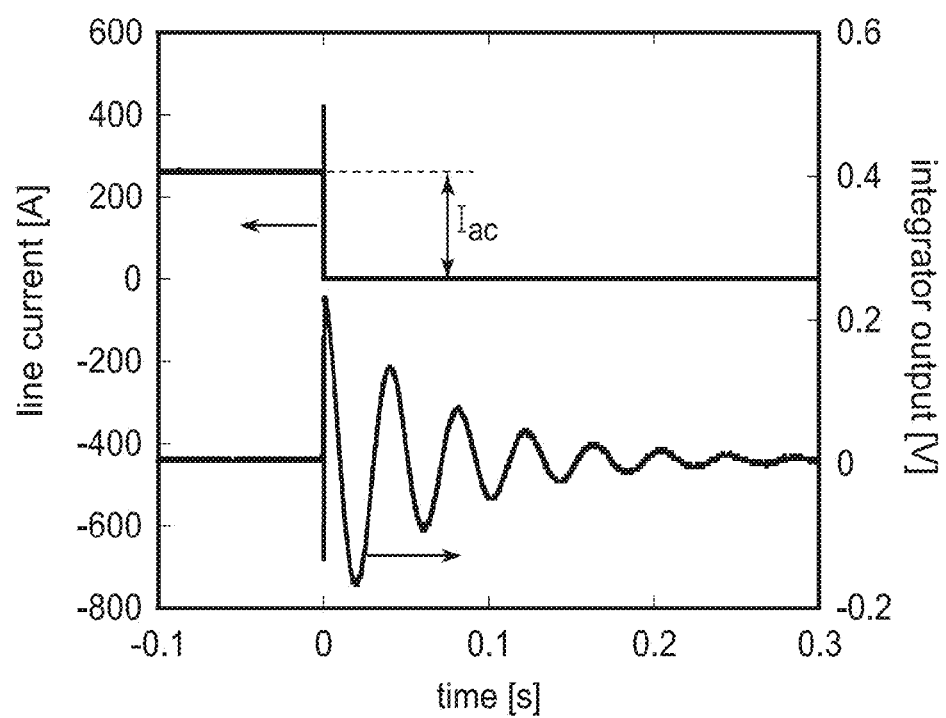
FIG. 6 is a graph of the line step current and impulse response of the integrator circuit of FIG. 2.

The inverse Laplace transformed impulse response of circuit 20 is provided in equation 17 with the input impulse content of $V_0 \tau_0 = M I_{ac}$ with M the Rogowski coil coefficient of mutual inductance and with $I_{ac}$ the current step amplitude shown in FIG. 6.

$$V_{out}(t) \approx \frac{-MI_{ac}}{\tau_1}\left[\frac{-\tau}{e^{\tau_2}}\left(\cos\frac{rt}{\tau_2} - \frac{1}{r}\sin\frac{rt}{\tau_2}\right) - e^{\frac{-t}{\tau_0}}\right] \quad (17)$$

Equation (17) is a very good approximation when $|\omega_0| \gg |\omega_1|$, $|\omega_2|$ and demonstrates the integrator circuit stability with always decaying impulse response solutions. With equation (17) it is possible to think of the integrator as an electronic tuning fork with resonance frequency well below the 60 Hz line frequency.

FIG. 6 is a graph of the line current step response of circuit 20, showing an actual line current step of 250 A and the resulting integrator circuit 20 ringing response.

The exemplary component values provided for the resistors and capacitors in circuit 20 are in ohms and farads. Other component values can be used depending upon, for example, a particular application of circuit 20. When a component is described as coupled to another component, the components can be directly coupled or coupled through other components for electrical communication among them. The term input to a component can include a single input or multiple inputs. The term output from a component can include a single output or multiple outputs.

The invention claimed is:

1. An integrator circuit for a current sensor, comprising:
   an integrator having an input for receiving a signal from a current sensor and having an output providing a voltage signal;
   a high-pass filter having an input coupled to the output of the integrator and having an output, wherein the high-pass filter substantially removes a DC content from the voltage signal;
   a voltage follower having an input coupled to the output of the high-pass filter and having an output; and
   a difference amplifier having a first input coupled to the output of the integrator, a second input coupled to the output of the voltage follower, and an output providing the DC content of the voltage signal to the input of the integrator,
   wherein the output of the voltage follower provides a signal related to the signal from the current sensor,
   wherein the voltage follower provides a ringing signal in response to a current step detected by the current sensor.

2. The integrator circuit of claim 1, wherein the input of the integrator is configured to receive the signal from a Rogowski coil.

3. The integrator circuit of claim 1, wherein the voltage follower comprises an operational amplifier.

4. The integrator circuit of claim 1, wherein the integrator comprises an operational amplifier and a capacitor coupled in parallel with the operational amplifier.

5. The integrator circuit of claim 1, further comprising a variable resistor coupled to the input of the integrator.

6. The integrator circuit of claim 1, wherein a resonance frequency of the integrator circuit does not exceed 10 Hz.

7. A system for monitoring current, comprising:
   a current sensor located proximate a current conductor for detecting current in the conductor; and
   an integrator circuit coupled to the current sensor, comprising:

an integrator having an input for receiving a signal from the current sensor and having an output providing a voltage signal;

a high-pass filter having an input coupled to the output of the integrator and having an output, wherein the high-pass filter substantially removes a DC content from the voltage signal;

a feedback loop having an input coupled to the output of the integrator and to the output of the high-pass filter and having an output providing the DC content of the voltage signal to the input of the integrator; and a voltage follower coupled between the output of the high-pass filter and the feedback loop, wherein the voltage follower has an output terminal providing a signal related to the signal from the current sensor, wherein the integrator circuit resonance property provides a ringing signal at the output terminal in response to a current step in the current conductor.

8. The system of claim 7, wherein the current sensor comprises a Rogowski coil.

9. The system of claim 7, wherein the feedback loop comprises a difference amplifier having a first input coupled to the output of the integrator, a second input coupled to the output of the high-pass filter, and the output providing the DC content.

10. The system of claim 7, wherein the integrator comprises an operational amplifier and a capacitor coupled in parallel with the operational amplifier.

11. The system of 7, wherein a resonance frequency of the integrator circuit does not exceed 10 Hz.

* * * * *

UNITED STATES PATENT AND TRADEMARK OFFICE
CERTIFICATE OF CORRECTION

PATENT NO. : 9,588,147 B2
APPLICATION NO. : 14/613589
DATED : March 7, 2017
INVENTOR(S) : Martin Vos Page 1 of 1

It is certified that error appears in the above-identified patent and that said Letters Patent is hereby corrected as shown below:

In the Specification

Column 4
Line 49 (Approx.), Delete "w" and insert -- ω --, therefor.

In the Claims

Column 7
Line 31, In Claim 11, after "of" (first occurrence) insert -- claim --.

Signed and Sealed this
Twenty-sixth Day of September, 2017

Joseph Matal
*Performing the Functions and Duties of the
Under Secretary of Commerce for Intellectual Property and
Director of the United States Patent and Trademark Office*